US005461377A

United States Patent [19]

Oono et al.

[11] Patent Number: 5,461,377

[45] Date of Patent: Oct. 24, 1995

[54] PANEL UNIT OF DEALING BOARD

[75] Inventors: Fumiyoshi Oono; Tomonobu Watanabe; Yoshitada Yaginuma, all of Fukushima, Japan

[73] Assignee: Hitachi Telecom Technologies, Ltd., Koriyama, Japan

[21] Appl. No.: 358,570

[22] Filed: Dec. 13, 1994

Related U.S. Application Data

[63] Continuation of Ser. No. 857,428, Mar. 25, 1992, abandoned.

[30] Foreign Application Priority Data

| | | | |
|---|---|---|---|
| Mar. 27, 1991 | [JP] | Japan | 3-085964 |
| Apr. 23, 1991 | [JP] | Japan | 3-117864 |
| Jul. 11, 1991 | [JP] | Japan | 3-196130 |

[51] Int. Cl.[6] .......... H03K 17/94

[52] U.S. Cl. .......... 341/22; 341/34; 345/170

[58] Field of Search .......... 341/27, 23, 22, 341/34; 345/170

[56] References Cited

U.S. PATENT DOCUMENTS

| | | | |
|---|---|---|---|
| 3,777,222 | 12/1973 | Harris | 341/27 |
| 4,644,326 | 2/1987 | Villalobos et al. | 345/170 |
| 4,844,637 | 7/1989 | Buisson et al. | 341/23 |
| 5,121,091 | 6/1992 | Fujiyama | 341/27 |

FOREIGN PATENT DOCUMENTS

| | | |
|---|---|---|
| 63-185147 | 7/1988 | Japan . |
| 63-185148 | 7/1988 | Japan . |
| 63-177645 | 7/1988 | Japan . |

*Primary Examiner*—Brent Swarthout
*Assistant Examiner*—Andrew Hill
*Attorney, Agent, or Firm*—Foley & Lardner

[57] ABSTRACT

A panel unit for a dealing board has a display and a keyboard unit provided with buttons. The display is divided into individual indications which display function names corresponding to the buttons. The keyboard unit has a printed substrate arranged on the display, fixed contacts which form switches provided for the buttons, and electric conductive contact rubber located on the printed substrate and provided with moving contacts opposing the fixed contacts. A panel is positioned on the electric conductive rubber and provided with the buttons. The panel has holes, the buttons are fitted into the holes to be vertically movable so that the fixed contacts of the printed substrate come into contact with the movable contacts of the electric conductive rubber. The buttons are provided with an engagement portion for preventing the buttons from coming off the panel and the electric conductive contact rubber and the printed contact have relief holes in which the buttons are fitted when the engagement portion holds the buttons, as well as belt-like through holes for making the individual indications corresponding to the buttons visible.

2 Claims, 15 Drawing Sheets

PANEL UNIT OF DEALING BOARD

This application is a continuation of application Ser. 07/857,428, filed Mar. 25, 1992, abandoned.

BACKGROUND OF THE INVENTION

1. Field of the Invention

The present invention relates to a panel unit of a dealing board adapted to be employed in terminals of banks and financial organizations.

2. Description of the Prior Art

Nowadays, the terminals in banking organizations uses a dealing system carrying out transactions or dealings of securities, shares, and foreign exchange by means of telephone lines. A unit for such dealing system has a dealing board provided with operating portions and multi-function telephones and the like, a desk on which the dealing board is installed. The dealing system is constructed by installing a plurality of the desks in a dealing room.

FIG. 28 shows a conventional desk 50 installed in the dealing room. The desk 50 has an operation part 51 having various telephoning functions and a dealing board 53 having a hand-set 52, respectively placed on the desk. Further, the desk 50 has a display appliance 54 placed on the rear part of the desk so as to show economic information and the like.

In order to use the dealing board 53 as a communication means, the dealing board provides a set panel units containing a dial operating portion 55, a displaying portion 56 of, for example, a liquid crystal display and the like showing the name of a sender, a volume dial 57 for controlling sound volume of the hand-set 52 and dark-and-light level of the displaying portion 56, and a set of one-touch dial buttons 58 (hereinafter referred to as merely a button) for calling out the particular or appointed customer in a one-touch manner through the telephoning lines or network.

Each button 58 has a label on which the name of a client is printed and stucked onto its top face in order to shown the name of the client on the button.

Because the dealing board 53 is used for different clients, it has been necessary to paste different set of labels for different dealing boards 53 to the top faces of the buttons 58 in accordance with the prior art. It has been difficult to mass-produce the dealing boards and cope with a change in demand which occurs when personal changes are made and similar changes are done in client companies.

FIG. 30 shows one of the apparatus for solving such problem of the conventional method. According to the prior art, a liquid crystal indicator 59 is installed by a button 58 as shown in FIG. 30. Names of the customers are indicated on the liquid crystal indicator 59 of the panel unit of the conventional dealing board and can be easily changed by means of controlling the software in the computer.

According to the prior art, due to the narrow space for containing the mounted parts of the panel unit, the indication device is restricted to ones of a liquid crystal, such as the liquid crystal indicator 59. It is noted that the characters displayed on the indicator 59 of such kind is not clear and the viewing angle is narrow. In addition, the liquid crystal indicator 59 must be mounted on every low of the buttons 58, so that the electric wiring of the liquid crystal indicator 59 is made complicated and a mounting operation of the liquid crystal indicator 59 necessitates much hand-work.

According to another indication method of the customer names on the panel unit, a touching panel is placed on the top face of a plasma display device and the like, so that it is possible to recognize the names of the customers without labels attached onto the top faces. According to such panel unit, when light of ultraviolet ray LEDs arranged on the top face of the display device in a matrix shape is interrupted by a finger of the operator, the position of the finger is detected and it functions as a switch. As a result, there is no feeling of pressing the buttons and the operability of the panel unit is deteriorated. Because the indicator 59 is directly touched, the indicator 59 is apt to become dirty deteriorating visibility of the indicators.

Additionally, the conventional dealing board 53 used as a terminal of financial organizations or companies deals with financial transactions by means of telephone lines, so that it is necessary to provide telephone functions and a keyboard for using these telephone functions.

In the conventional dealing board 53, the keyboard is made and used as a unit and the united keyboard has operation buttons as shown in FIG. 31 and FIG. 32.

In detail, the operation button shown in FIG. 31 consists of a button 58, an electric conductive contacting rubber 59 placed below the button 58, a printed substrate 61, and a panel 62 covering the printed substrate 61. The button 58 is adapted to be urged upwardly by a resiliency of the electric conductive contact rubber 59. An outwardly projected engagement portion 63 is formed on the lower and outer circumferential portion of the button 58. Because the engagement portion 63 engages with the bottom face of the panel 62, the button 58 doesn't get out of place from a hole 64 of the panel 62.

When the button 58 such constructed above is pressed, the button 58 lowers by a stroke S and a contact portion 65 placed on the electric conductive contact rubber 59 comes in contact with contacts 66 on the printed substrate 61 leading electricity between these contacts 66. It is apparent that the low and of the button 58 is separated from a top face of the electric conductive contact rubber 59 by a gap X2, thereby the former cannot come in contact with the latter even when the contact portion 65 comes in contact with these contacts 66.

When the thickness of the panel 62 is shown by D, a height of the engagement portion 63 is C, and the thickness of the electric conductive contact rubber 59 is B, a total of D, C, and B, as well as the stroke S and the gap X2 equals to a thickness size A measured from the top face of the printed substrate 61 to the top face of the panel 62.

Other operation buttons shown in FIG. 33 and FIG. 34 have been used in the field. The button shown in FIG. 33 has a dome-like button 68, and a polyester sheet 67 having its upper surface printed and covering the button 68. Another button shown in FIG. 34 has a silicon rubber sheet 69 in addition to the dome-like button 68 and the polyester sheet 67, and a different button 70 connected to the silicon rubber sheet 69. It is apparent that the flat button 70 is placed on and above the dome-like button 68. A thickness size A of the button shown in FIG. 34 measured from the top face of the printed substrate 61 to another top face of the panel 62 is exceedingly shorter than the size A of the operation button shown in FIG. 31.

The conventional operation buttons 68 and 70 shown in FIG. 33 and FIG. 34, respectively have strokes S of only about 1 mm because a molding process of polyester material has a restriction and life of the polyester sheet 67 is short. Consequently, operation or pressing feeling of the buttons 68 and 70 are bad. When these buttons 68 and 70 are employed in the dealing board and they are used frequently, they will be broken soon. It is said that they have poor reliability in operation.

When the thickness size measured from the top face of the printed substrate 61 and the top face of the button 58 in the conventional keyboard unit 53 is made small, insulation resistance between the printed substrate 61 and the button 58 becomes low, static electricity noise impressed to around the button 58 through its top side is transferred to a signal pattern 72 connected to an electrode of the contact 71 shown in FIG. 35, and entered into an electronic circuit from a through hole 73 through a connector, thereby generating errors in operation.

SUMMARY OF THE INVENTION

According to the present invention, a panel unit of the dealing board provided with an indicating portion consisting of a plurality of buttons and a display is provided. The panel unit has a keyboard unit consisting of a printed substrate having a plurality of buttons and a contact sheet and clicking means giving click feeling to the operator when the operator pushes the button. The keyboard unit is provided on the display. The printed substrate of the keyboard unit has a plurality of through holes through which indications of respective buttons on the display can be seen. The contents indicated on the display can be easily changed by changing the computer software, as well as click feeling can be obtained when the buttons are pressed or pushed improving the operability of the dealing board of the present invention.

According to the keyboard unit of the present invention, an electric conductive contact rubber and a panel are provided on the printed substrate. The panel has a plurality of holes open or formed therein and the plurality of buttons are vertically movably inserted into the plural holes so as to contact the contacts of the printed substrate and the contact portions of the electric conductive contact rubber.

The portions facing engagement portions so formed in the material of the button as to prevent the button from coming out of the keyboard unit have relief holes through which the engagement portion enters when the button is pressed. Consequently, it is possible to make small, by only thining the electric conductive contact rubber and the panel without changing the stroke of the button, the thickness size measured from the top face of the printed substrate and the top face of the panel in order to lessen a non-watchable range of the display without any deterioration on a manual feeling of the buttons.

Also, according to the keyboard unit of the present invention, which unit having the printed substrate provided with the electric conductive contact rubber and the panel, respectively formed on the substrate, a plurality of holes are open on the panel and a plurality of buttons for making the contact of the printed substrate and the contact portion of the electric conductive contact rubber contact to each other are inserted into the holes so as to freely move in a up-and-down direction. Further, the portions facing to the engagement portion of the button which portion prevents the button from coming out of the hole provide with a relief hole through which the engagement portion of the button is inserted when the button is pushed, an earth pattern is formed around the contact of the printed substrate. When the button is pressed, the engagement portion of the button is inserted into the relief hole and lowers without conflict between the button and the electric conductive contact rubber or the printed substrate, as a result, by only making the thicknesses of the electric conductive contact rubber and the panel thin without changing the stroke of the button, it is possible to make small the thickness size measured from the top face of the printed substrate and the top face of the panel and the non-watchable range of the display without deterioration of the manual feeling. Because static electricity noise impressed on around the button from its top face side is transferred to the earth pattern around the contact before it is transferred to a contact and the signal pattern connected to the contact, it is possible to prevent static electricity noise from transferring to the signal pattern in order to prevent the electronic circuits from erroneous functioning due to such static electricity noise.

Consequently, the first purpose of the present invention is to provide a panel unit of the dealing board in which the indications of the buttons indicated on the display is easily seen and the computer software easily changes the indication contents.

The second purpose of the present invention is to provide a panel unit of the dealing board in which the thickness size from the top face of the printed substrate to another top face of the panel is small and having operation buttons with good manual feeling.

The third purpose of the present invention is to provide a panel unit of the dealing board of a small thickness size measured from the top face of the printed substrate to the top face of the panel, operative buttons of good manual feeling or touch sensing, and no static electricity noise impressed to about the button from its top and entered to the electronic circuits generating no error function of the circuits.

DESCRIPTION OF THE EMBODIMENTS

Figure 1:
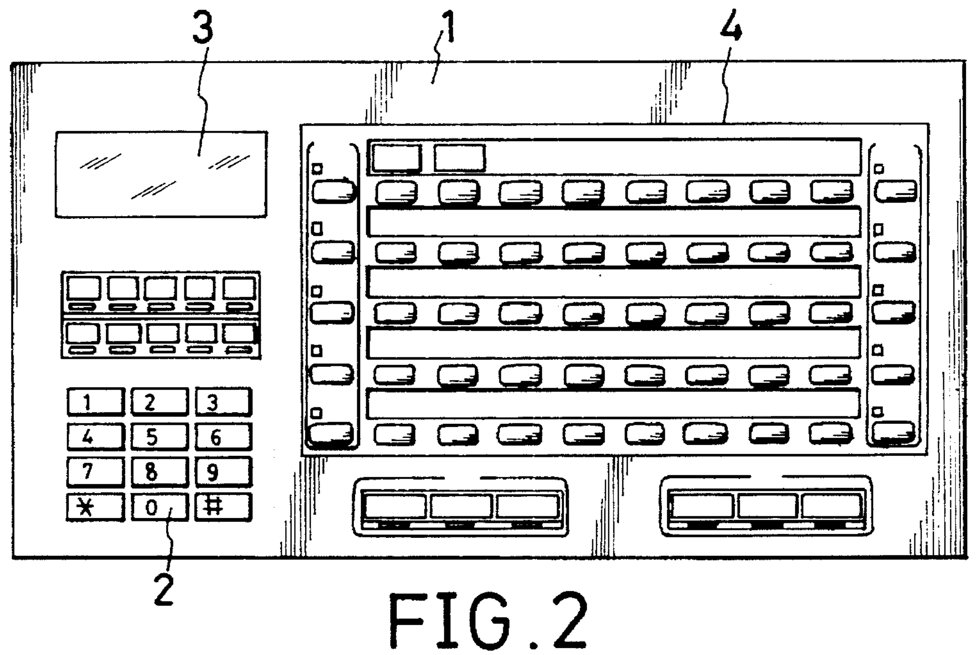
FIG. 1 is a plan view showing a panel unit of the dealing board according to one embodiment of the present invention.
Figure 2:
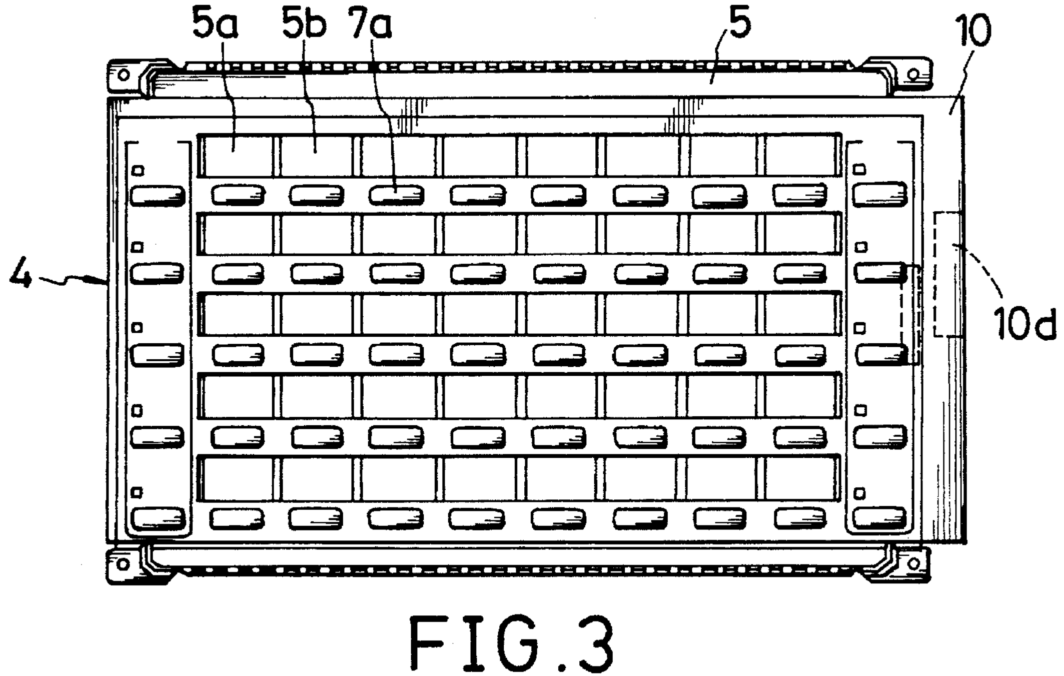
FIG. 2 is a plan view of the indication portion constructing the panel unit.
Figure 3:
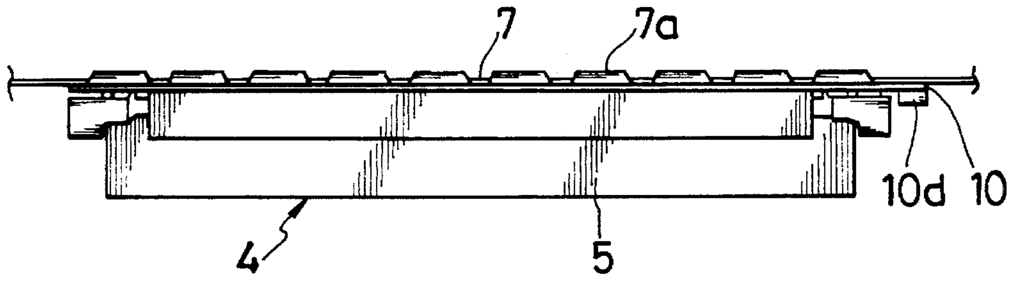
FIG. 3 is a side view of the indication portion above.

As shown in the plan view of FIG. 1 of the panel unit used in the operation portion of the dealing board according to the present invention, the main body 1 of the panel unit has a dial operation portion 2, a liquid crystal indicator 3 displaying names and the like of senders, and indicating portion 4, respectively installed on the main body 1.

The indicating portion 4 consists of a single display unit 5, such as a liquid indicator and a plasma display and etc. and a keyboard unit 6 placed on the display unit 5.

The display unit 5 enables to any information at any position thereon by means of a software. The characters 5*a* in, for example, two lines and four rows are shown at through holes 7*b*, each placed adjacent to a number of protruded buttons 7*a*, and individual indication 5*b* enclosing these characters 5*a*. These protruded buttons 7*a* are formed on a surface sheet 7 consisting of the keyboard unit 6.

Figure 4:
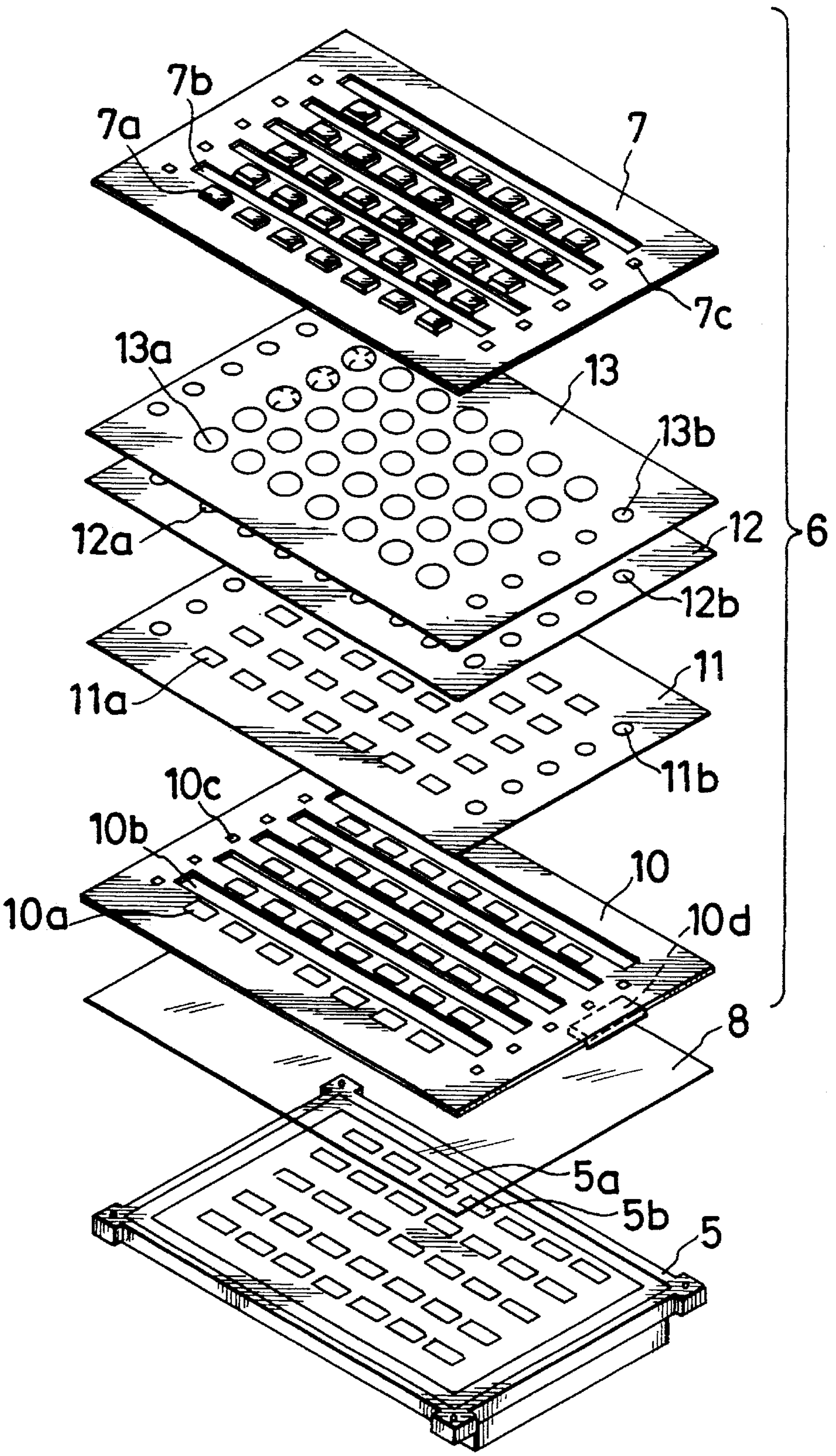
FIG. 4 is an exploded perspective view of the indication portion.
Figure 5:
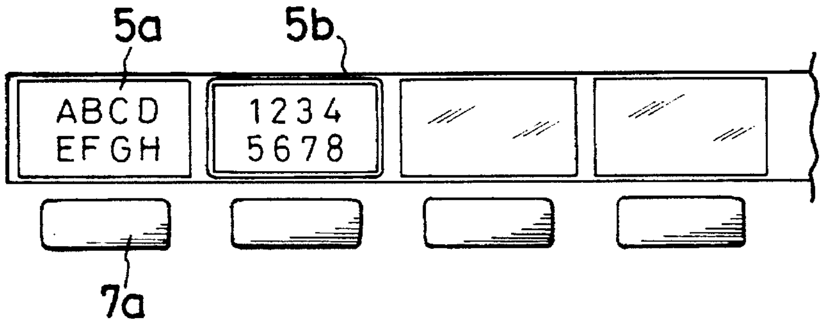
FIG. 5 is an enlarged view of the important portion of the indication portion.
Figure 6:
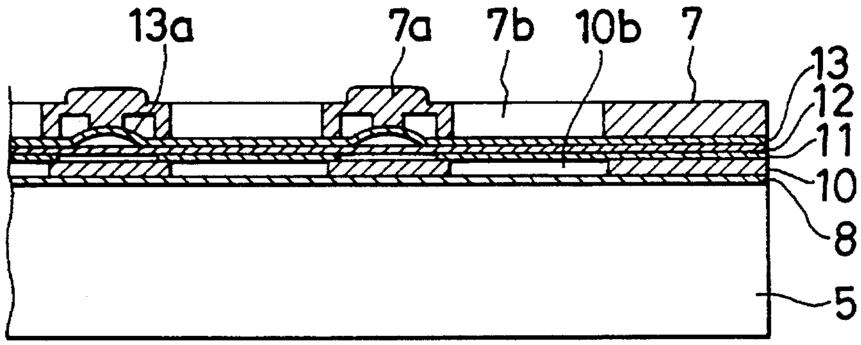
FIG. 6 is an enlarged sectional view of the important portion.
Figure 7:
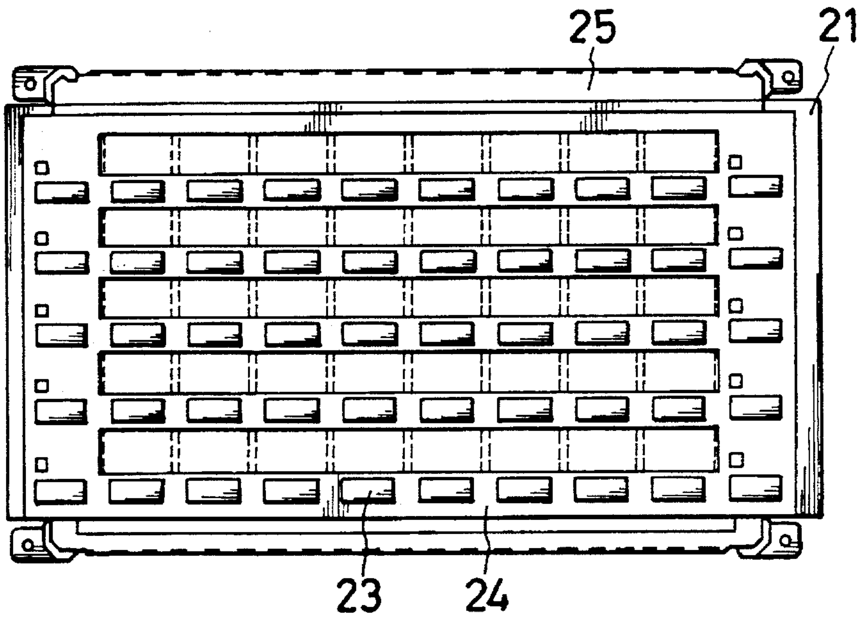
FIG. 7 is a plan view showing the keyboard unit according to another embodiment of the present invention.
Figure 8:
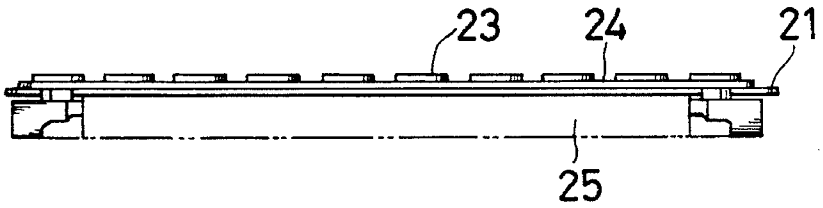
FIG. 8 is a front view of the another embodiment above.
Figure 9:
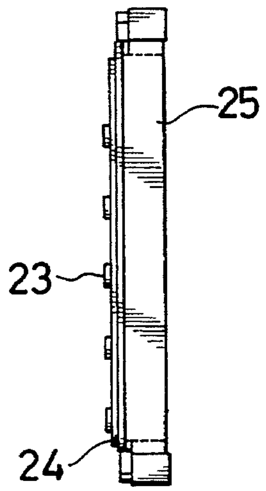
FIG. 9 is a side view of the another embodiment.
Figure 10:
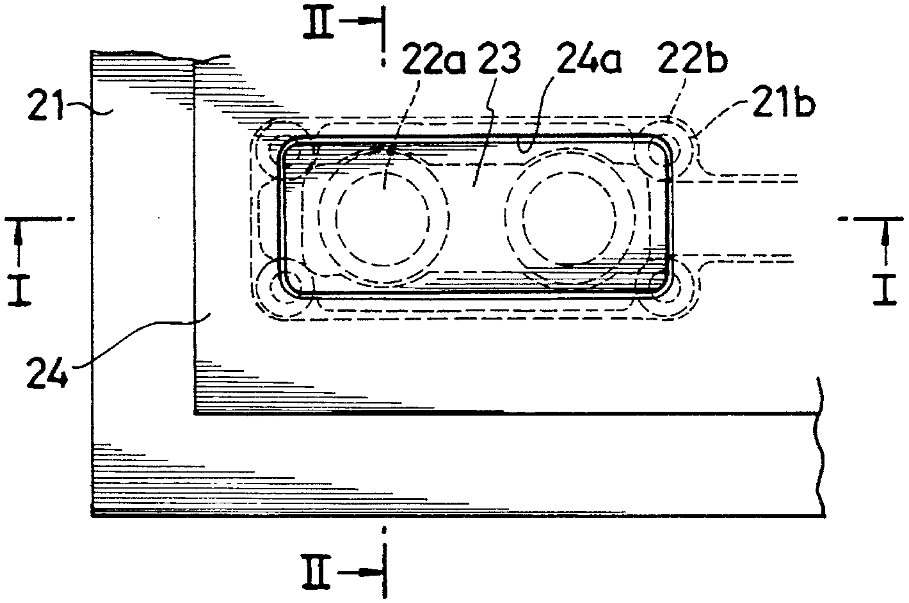
FIG. 10 is an enlarged section showing the operation buttons and its neighboring portion of the keyboard unit according to the other embodiment.

These individual indication 5*b* show one thin line, double thin lines, a thick line, a bold line, or flicking line in order to show various operation conditions of communication receiving, communication sending, and a usage of another machine of the same group. The keyboard unit 6 is placed on the display unit 5 through a reflecting plate 8 in order to make the display unit 5 easy to see. As shown in FIG. 4, the keyboard unit 6 is constructed by piling in order a printed substrate 10, an insulation sheet 11, a contacting sheet 12, a click sheet 13, and a top face sheet 7.

The printed substrate 10 has carbon contacts 10*a*, respectively printed at places corresponding to the positions of a plurality of buttons 7*a* formed on the top face sheet 7. A belt-like through holes 10*b* are formed at the positions corresponding to these of the individual indication 5*b* of the display unit 5, therefore contents of the display unit 5 can be seen through these holes 10*b*.

If necessary, a plurality of chips LED 10*c* are installed on the top face and at both sides of the printed substrate 10 in order to indicate operation conditions of the corresponding button 7*a* through function of the chips LED 10*c*. A connector 10*d* of a face-attaching type is attached to a rear face of the printed substrate 10, thereby the carbon contacts 10*a* and the chips LED 10*c* on the printed substrate 10 are electrically connected to another printed substrate (not shown) through the connector 10*d*.

While, the insulation sheet 11 is formed on a non-color transparent film and has a set of through holes 11*a* and 11*b* of square and round at positions corresponding to that of the carbon contacts 10*a* and the chips LEDs 10*c* formed on the printed substrate 10. The carbon contacts 10*a* on the printed substrate 10 and other carbon contacts 12*a* formed on the bottom face of the contact sheet 12 are insulated from each other so as to prevent these contacts 10*a* and 12*a* from coming in contact with each other while the button 7*a* on the top face sheet 7 is not pressed.

The contact sheet 12 is made of a non-color transparent film similar to that of the insulation sheet 11 and has a set of carbon contacts 12*a* placed at positions corresponding to the carbon contacts 10*a* of the lower printed substrate 10. These carbon contacts 12*a* are apparently formed by printing in order to construct a switching function between the carbon contacts 12*a* and other carbon contacts 10*a* on the printed substrate 10. The contact sheet 12 has also a set of through holes 12*b* at positions corresponding to the chips LED 10*c* on the printed substrate 10.

The click sheet 13 is made of a non-color transparent film and has a doom-like protrusion 13*a* formed at positions corresponding to the carbon contact 10*a* of the printed substrate 10 and the carbon contact 12*a* of the contact sheet 12. The protrusion 13*a* is adapted to be resiliently deformed when the button 7*a* of the top face sheet 7 is pressed giving a click-feeling to a finger of the operator, and return to raise the button 7*a* to its original position when the finger is left from the button 7*a*.

In addition, the click sheet 13 has a number of through holes 13*b* formed at positions corresponding to the chips LED 10*d* on the printed substrate 10.

While, the top face sheet 7 is made of a silicone rubber, and has buttons 7*a* formed at positions corresponding to the carbon contacts 10*a* and 12*a* and long or belt-like through holes 7*b* formed at positions corresponding to the positions corresponding to the frame indications 5*b* of the display unit 5 enabling to see the contents of the display unit 5 therethrough.

A number of protrusions 7*c* a little larger than the chips LED 10*c* are formed at positions of the printed substrate 10 corresponding to the chips LED 10*c* so as to accommodate the chips LED 10*c*.

Operation of the keyboard panel unit of the present invention will be described.

When the panel unit main body 1 is employed to the dealing board, the contents of every button 7*a* displayed in the display unit 5 can be seen through the through holes 10*b* and 7*b* formed in the keyboard unit 6.

As a result, it is possible to easily know the name of the client to which the particular button 7a led by displaying information of the clients at every button 7a.

When a telephone is taken to a client, it is necessary to push the button 7a showing the particular client's name. The button 7a makes the protrusion 13a of the click sheet 13 resiliently deform, a finger feels a clicking, the contact sheet 12 is pressed making the carbon contact 12a on the bottom of the contact sheet 12 come into contact with the carbon contacts 10a on the printed substrate 10. Therefore, the switch is made ON. Thus, it is possible to call up the client by one-touch operation.

While, the client indication of respective buttons 7a can be easily changed by changing software, therefore it is very easy to carry out a change operation of the clients or customers which is due to personnel changes in the companies.

It is noted that, in order to improve operability of the panel unit of the embodiment above, the top face sheet 7 provided with a number of buttons 7a is employed. It is possible to print the buttons on the click sheet 13 and a finger of the operator directly pushes the click sheet 13 according to an alternation of the panel unit. Also, it is possible to use a flat sheet having the buttons 7a printed thereon or another flat sheet provided with the buttons 7a thermally formed thereon in place of the top face sheet 7. When the top face sheet 7 is made of a transparent material number, it is possible to see the displayed contents of the display unit 5 without any through openings, such as through holes 7b.

According to the present invention, the keyboard unit 6 is installed on the display unit 5, the display unit 5 can be seen through the through holes 10b open in the keyboard unit 6, a plurality of the buttons 7a are formed on the keyboard unit 6, and respective clients names of each button 7a are displayed on the display unit 5, therefore watching the display unit 5 through the keyboard unit 6 recognizes the particular customer of the particular button 7a making communication with the customers easy and sure.

Because the contents displayed on the display unit 5 can be easily changed by changing software, it is possible to mass produce the dealing board 6 and decide the particular contents displayed on the button according to the particular customer after receiving the purchase order of the customer. Again, it is easy to set the display contents of the button according to respective customers, change the display contents after they are changed due to personnel changes in the client companies by means of changing software.

When the operator pushes the button 7a, he or she feels a clicking sound and can recognize that the button 7a is surely pressed, therefore operability of the panel unit is exceedingly improved. In addition, when the top face sheet is made of a transparent material, it is possible to easily obtain a panel unit of water-proof construction preventing water, foreign matter or wetty air from invading or entering to the keyboard unit 6 and the display unit 5.

FIG. 7 to FIG. 14, respectively show another embodiment of the key board unit used as an operation part of the dealing board.

It is apparent that a panel 24 has a plurality of square openings 24a arranged along vertical lines or rows and horizontal lines or columns, and buttons 23 each fitted into the square openings 24a.

The buttons 23 has a shape of thin plates. The button 23 has an engagement portion 23a formed at lower corners of the button 23. The engagement portion 23a is inserted to a bottom face of the panel 24 and engaged with the bottom face. The button 23 has projections or protrusions 23b formed on its bottom face coming in contact with a top face of a movable contact 22a of an electric conductive contact rubber 22.

The electric conductive contact rubber 22 is adapted to intimately contact with a printed substrate 21. Each button 23 has, for example, two movable contacts 22a protruding upward and attached on the bottom face of the button 23. A thin portion 22b of the movable contact 22a has a resiliency urging the button 23 upward. Two fixed contacts 21a adapted to be electrically connected to each other through the movable contact 22a are formed on the printed substrate 21. It is apparent that these fixed contacts 21a are placed under the movable contact portion 22a.

In addition, the electric conductive contact rubber 22 has a recess portion or relief hole 22c to which portion the engagement portion 23a projected from the corner of the button 23 is applied. The printed substrate 21 has another relief hole 22b formed therein. The engagement portion 23a of the button 23 is loosely inserted downward through these relief holes 22c and 21b.

The thickness of the electric conductive contact rubber 22 is decided so as not to project of the front end of the engagement portion 23a lower than the bottom face of the printed substrate 21 even when the button 23 is pressed and the movable contact 22a lowers by the stroke S.

Operation of the panel unit of the present invention will be explained with reference to the accompanying drawings.

Figure 11:
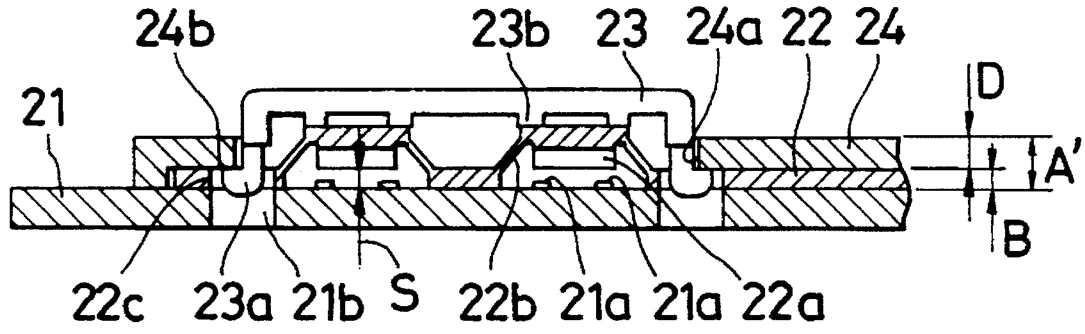
FIG. 11 is a section taken along a line I—I shown in FIG. 10.
Figure 12:
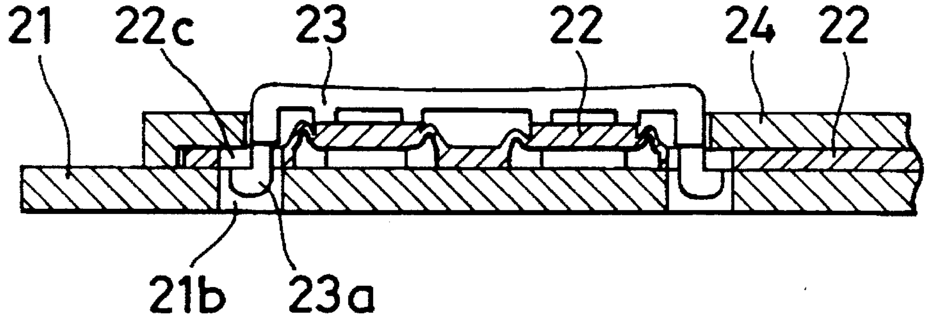
FIG. 12 is a section depicting an operation condition of the operation button.
Figure 13:
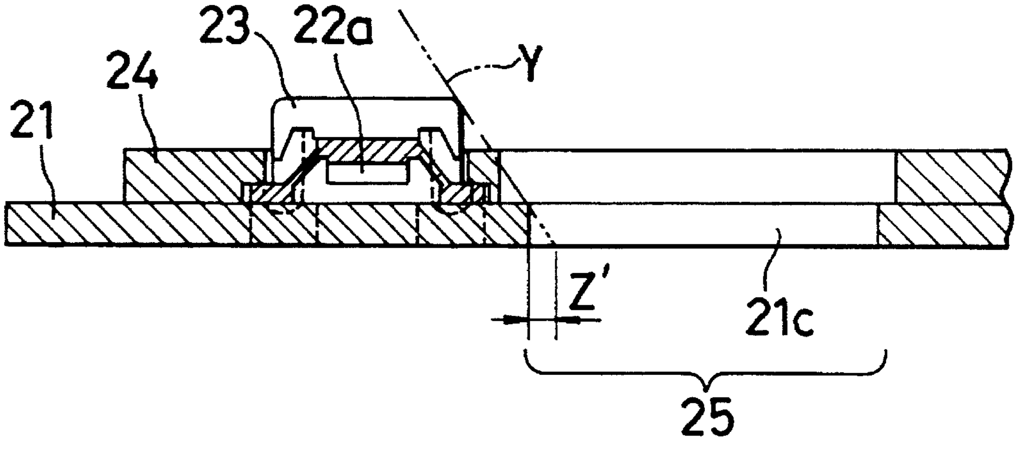
FIG. 13 is a section taken along a line II—II of FIG. 10.
Figure 14:
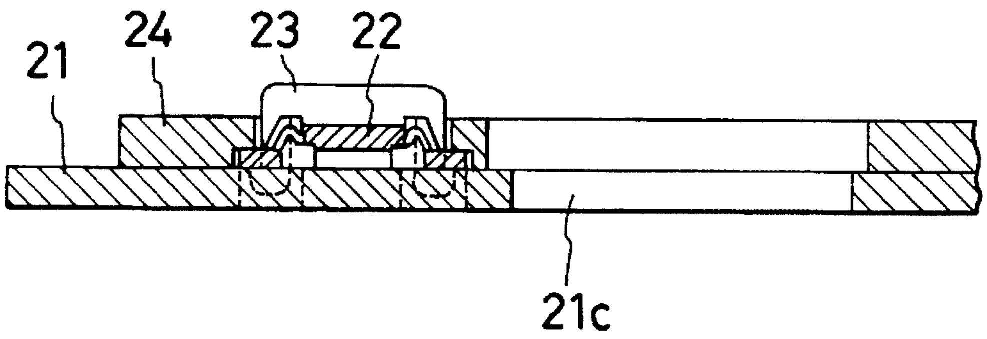
FIG. 14 is a section depicting an operation condition of the operation button.
Figure 15:
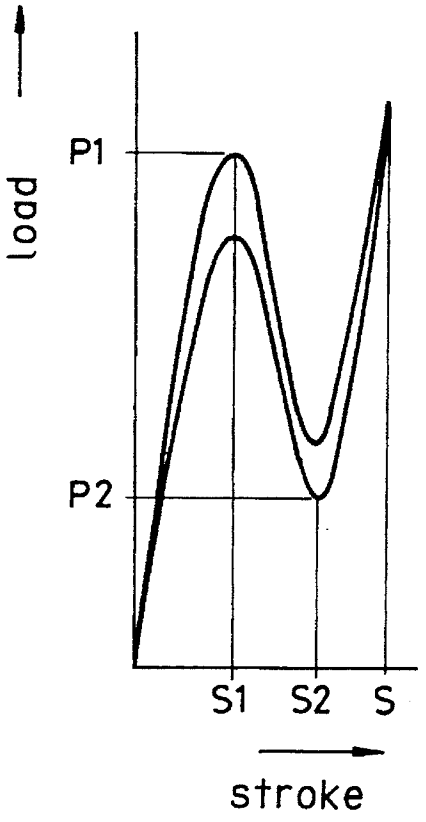
FIG. 15 is a diagram of curves depicting strokes and downing force of the electric conductive contact rubber.

When the button 23 is not pressed, resiliency of the thin portion 22b of the electric conductive contact rubber 22 raises the button 23 to a position shown in FIG. 11, at which position the engagement portion 23a engages with the bottom face of the panel 24 preventing the engagement portion 23a from coming out of the hole 24a.

Next, when the button 23 is pressed, the movable contact 22a strokes by a distance S and comes into contact with the fixed contact 21a on the printed substrate 21 leading the fixed contact 21a to each other. Then, the engagement portion 23a of the button 23 lowers through the relief holes 22c and 21b, respectively formed in the electric conductive contact rubber 22 and the printed substrate 21. Apparently, there is no intervention or conflict between the button 23 and the electric conductive contact rubber 22, and the button 23 and the printed substrate 21.

A thickness size A' measured from a top face of the printed substrate 21 to a top face of the panel 24 is determined with a thickness size B of the electric conductive contact rubber 22 and another thickness size D of the panel 24. The thickness size A' doesn't have relation to the stroke S, so that even when the stroke S becomes large, the thickness size A' can be made small by making these thickness sizes B and D small. Consequently, it is possible to make considerably small of a non-seeing range Z' for the display 25 even when the operator watches the display 25 slantly as shown by a dotted line Y in FIG. 13 through an open portion 21c formed in the printed substrate 21.

Next, pressing down characteristic of the button 23 will be explained.

Analysis value of pressing feeling of the button 23 is decided by the following equation.

$$V = \text{Operation load } P1/\text{restoring load } P2 \times \text{ stroke } S$$

When the value V becomes larger than 1.5, pressing feeling of the button 23 is said good.

Figure 16:
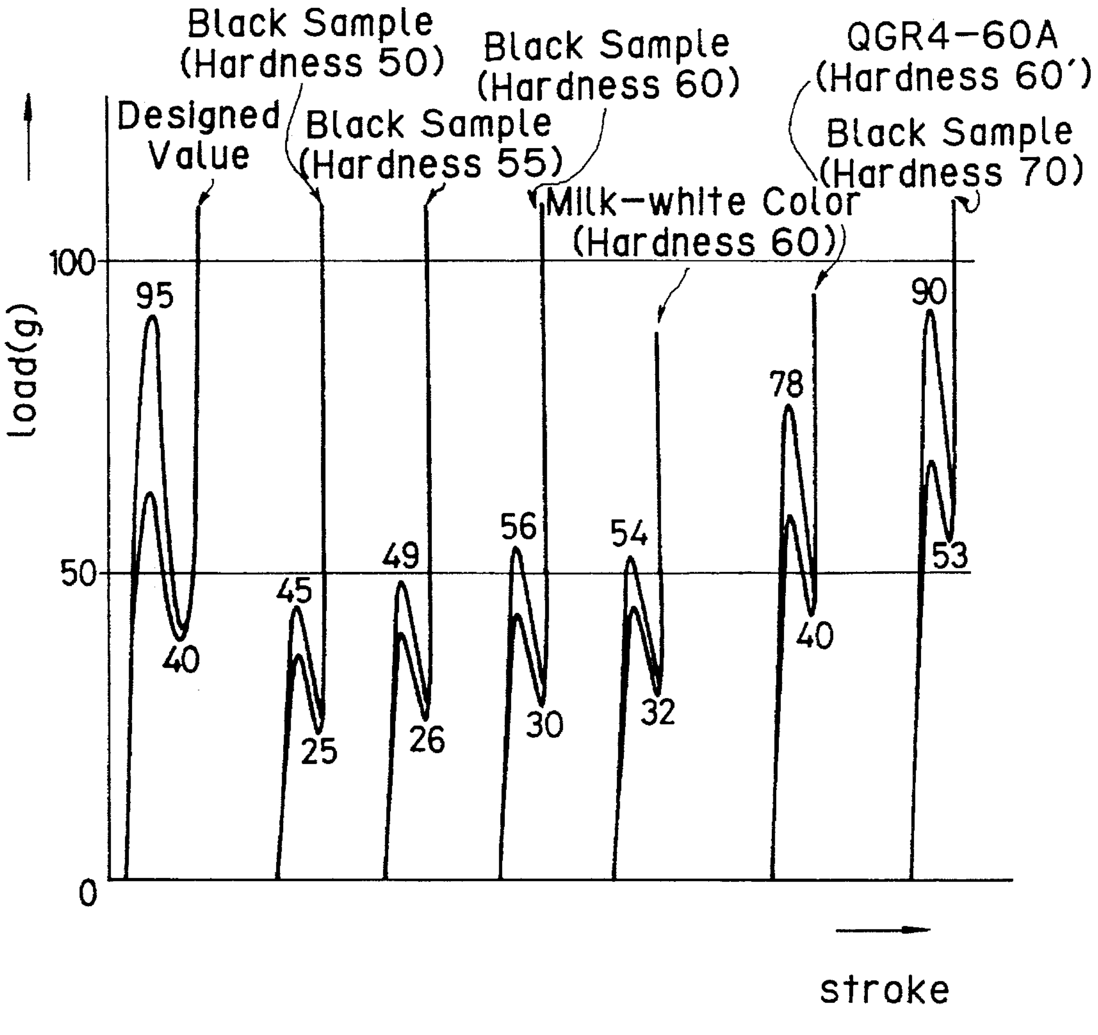
FIG. 16 is a diagram of the curves depicting strokes and pressing force in experiments.

FIG. 16 shows experimental results of characteristics of strokes and pressing forces with reference to various materials of the electric conductive contact rubber.

The following table 1 shows several analysis values V obtained from the experimental results. Comparing the analysis values to pressing feeling of a real button 23 decides that the best material for the button 23 is QGR4-60A (hardness 60').

TABLE 1

Comparing of Analysis Value V of Pressing Feeling

| material | designed value | Black sample (Hardness 50) | Black sample (Hardness 55) |
|---|---|---|---|
| V | 1.90 | 1.44 | 1.54 |
| Black sample (Hardness 60) | Black sample (Hardness 60) | Black sample (Hardness 60') | Black sample (Hardness 70) |
| 1.49 | 1.35 | 1.56 | 1.36 |

The size of the button 23 is a factor determining operability of the button. Two electric conductive contact rubbers 22 correspond to one button 23 as mentioned above, so that it is possible to exceedingly make the button 23 large and obtain some pressing feeling even when the corner of the button 23 is pressed improving its reliability.

Figure 17:
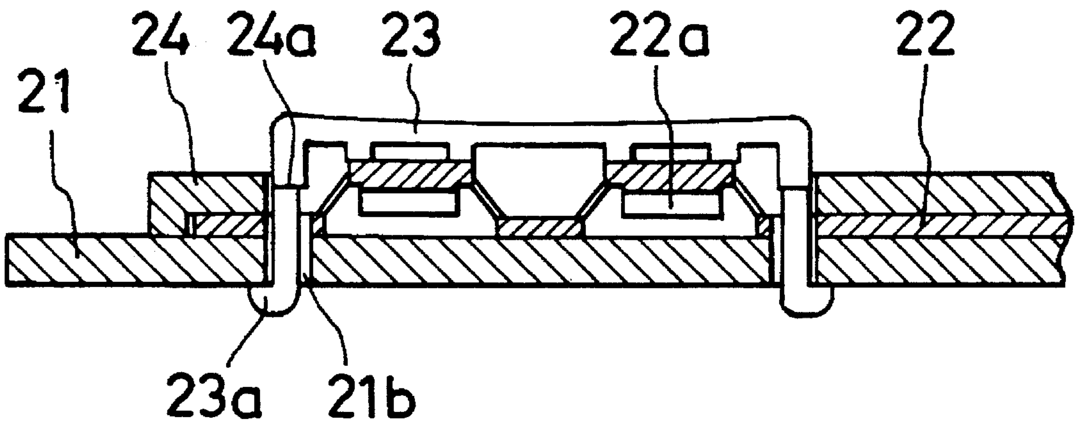
FIG. 17 is a section of the operation button according to another embodiment of the present invention.
Figure 18:
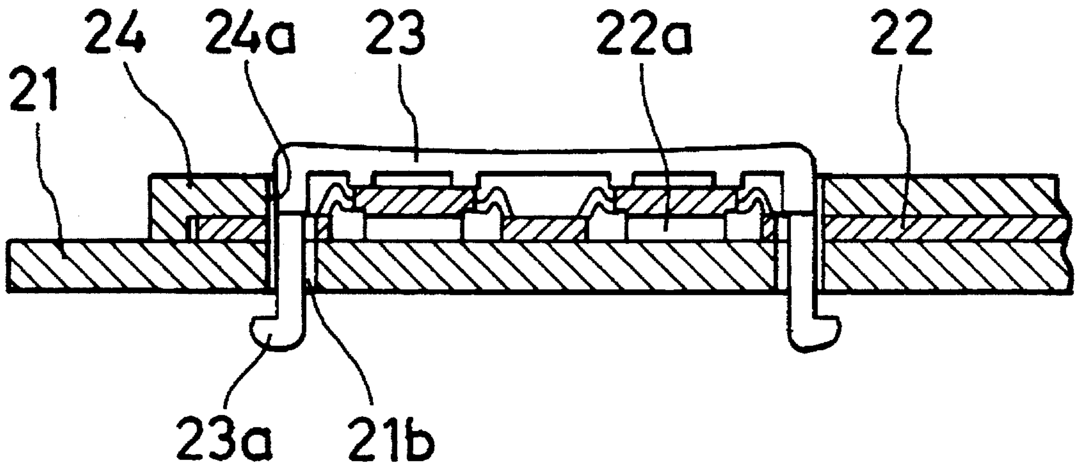
FIG. 18 is a section showing an operation condition of the operation button.
Figure 19:
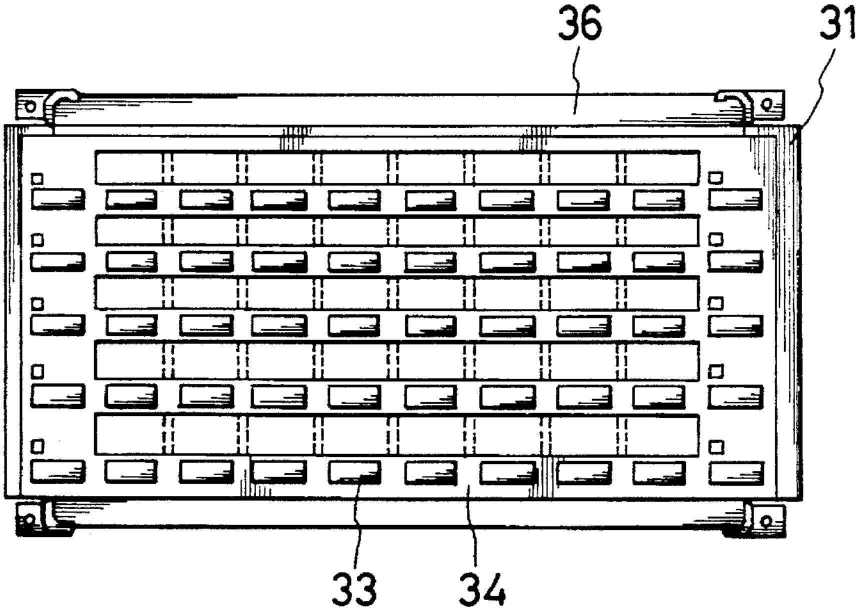
FIG. 19 is a flat view of another embodiment of the keyboard according to the present invention.
Figure 20:
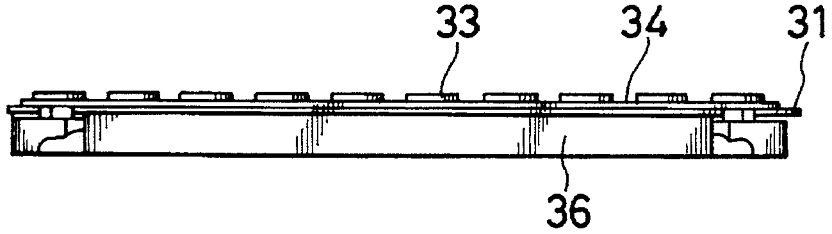
FIG. 20 is a front view of the embodiment shown in FIG. 19.
Figure 21:
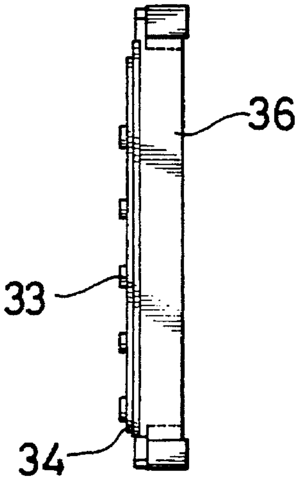
FIG. 21 is a side elevation of the embodiment above.
Figure 22:
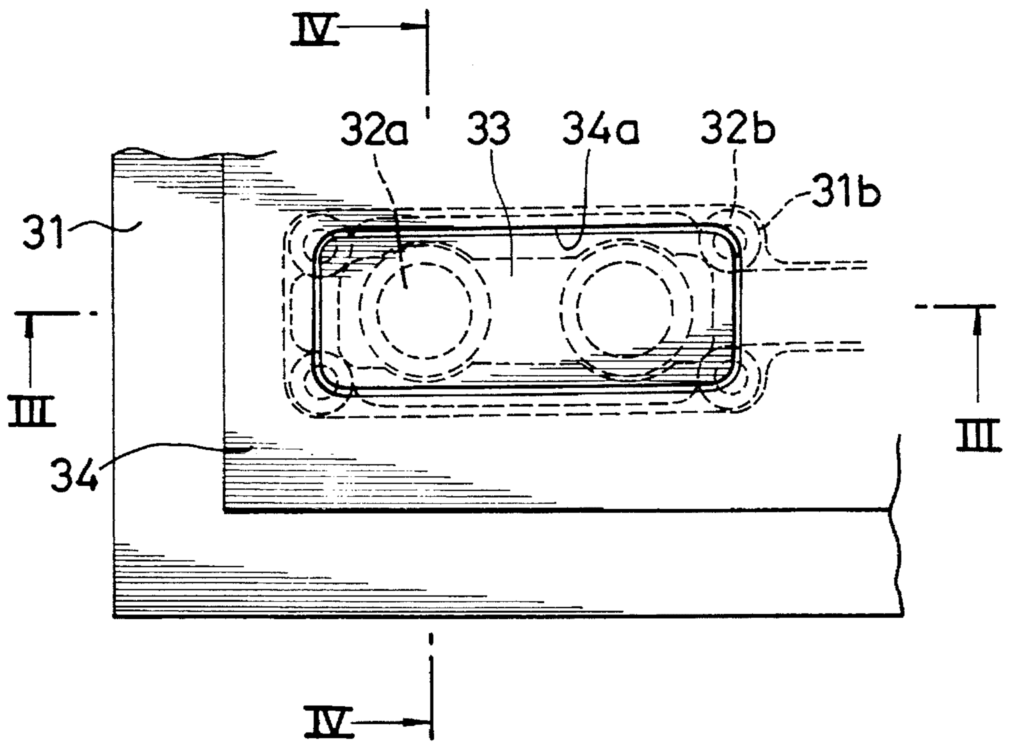
FIG. 22 is an enlarged plan view of a part about the operation button on the keyboard unit.
Figure 23:
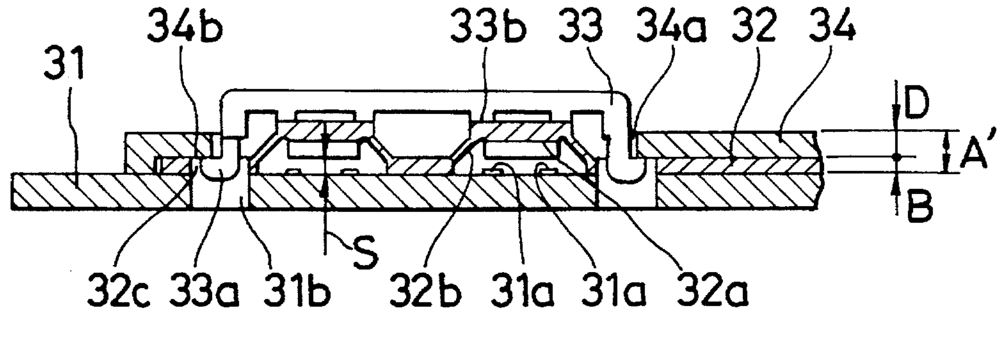
FIG. 23 is a section taken along the line III—III shown in FIG. 22.
Figure 24:
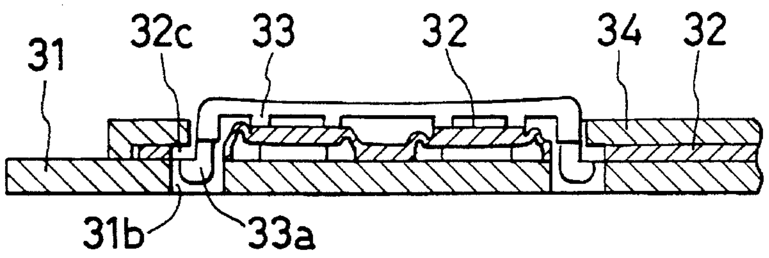
FIG. 24 is a section depicting an operation condition of the operation button.
Figure 25:
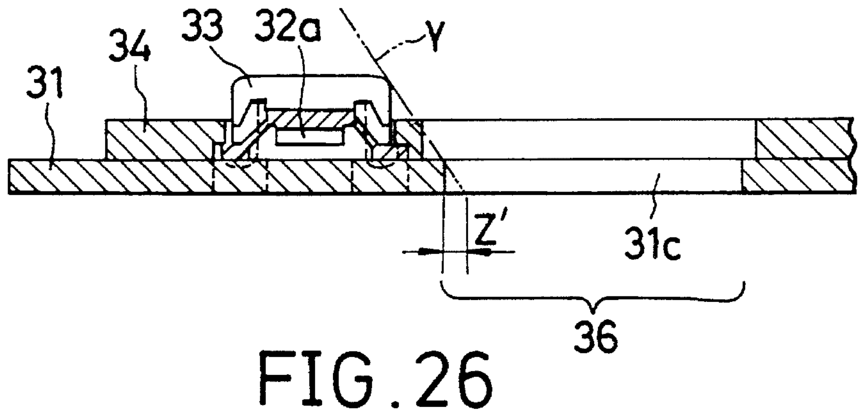
FIG. 25 is a section taken along the line IV—IV shown in FIG. 22.
Figure 26:
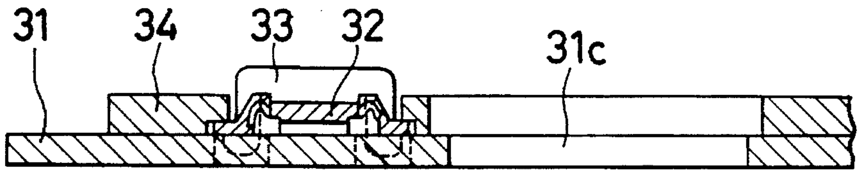
FIG. 26 is a section showing an operation condition of the operation button.

FIG. 17 and FIG. 18 show another embodiment of the panel unit of the present invention in which the engagement portion 23*a* of the button 23 projects downward from the lower face of the printed substrate 21 and the engagement portion 23*a* engages with the lower face of the printed substrate 21, preventing the button 23 from coming out of the square hole 24*a* of the panel 24. If there is a space under the printed substrate 21, it is possible to employ such construction and set at will the stroke S of the button B.

The keyboard unit has relief holes 22*c* and 21*b* formed at positions corresponding to the engagement portion 23*a* functioning as a coming-out preventor for the button 23 from the hole 24*a* of the panel 24. As a result, the engagement portion 23*a* of the button 23 enters, when the button 23 is pressed, into the relief holes 22*c* and 21*b* and the engagement portion 23*a* doesn't collide with the electric conductive contact rubber 22 and the printed substrate 21. Consequently, the electric conductive contact rubber 22 and the panel 24 are made thin, therefore a thickness size measured from the top face of the printed substrate 21 to the top face of the panel 24 can be made small without reducing the stroke of the button 23.

Consequently, a non-watching range of the display 25, when the display 25 is slantly seen, can been considerably reduced and as a result the display 25 can be easily watched.

Because the stroke attained, when the button 23 is pressed, is the same as that attained when the conventional electric conductive contact rubber is used, operation feeling is not deteriorated, as well as durability of the button 23 is exceedingly improved comparing to that made of polyester sheet. A high reliability is attained in the product of the panel unit of the present invention.

Another embodiment of the keyboard unit adapted to be used in the operation portion of the dealing board is shown in FIG. 19 to FIG. 27.

As shown, the panel 34 has a number of square holes 34*a* arranged in vertical rows and horizontal columns and buttons 33 are fitted into these holes 34*a*.

The button 33 is a thin one and has an engagement portion 33*a* adapted to engage upward with the lower face of the panel 34, which portion 33*a* projects from the lower corner portion. On the lower face of the button 33, there are protrusions 33*b* protruded so as to contact with the top face of the contact portion 32*a* of the electric conductive contact rubber 32.

The electric conductive contact rubber 32 is placed so as to intimately contact with the printed substrate 31. On the bottom face of the button 33, there are, for example, two contact portions 32*a* projecting upward. The buttons 33 are urged upward due to resiliency of the thin portion 32*b* of the contact portion 32*a*. A pair of contacts 31*a* led by the contact portion 32*a* as formed on the printed substrate 31 below the respective contact portions 32*a*.

The portions of the electric conductive contact rubber 32 and of the printed substrate 31, to which portions the engagement portions 33*a* projected from the corners of the button 33 abut, have relief holes 32*c* and 31*b*. The engagement portions 33*a* of the button 33 are loosely and downward inserted through the relief holes 32*c* and 31*b*.

The thickness of the electric conductive contact rubber 32 is decided so as to prevent the ends of the engagement portion 33*a* from projecting downward out of the lower face of the printed substrate 31 even when the button 33 is pressed and the contact portion 32*a* lowers by a stroke S.

Figure 27:
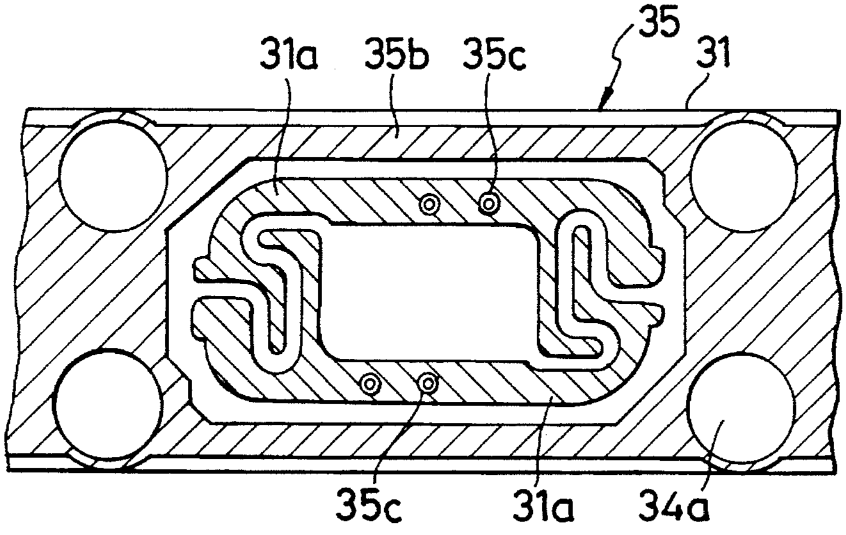
FIG. 27 is a detailed view of a contact in the keyboard unit.
Figure 28:
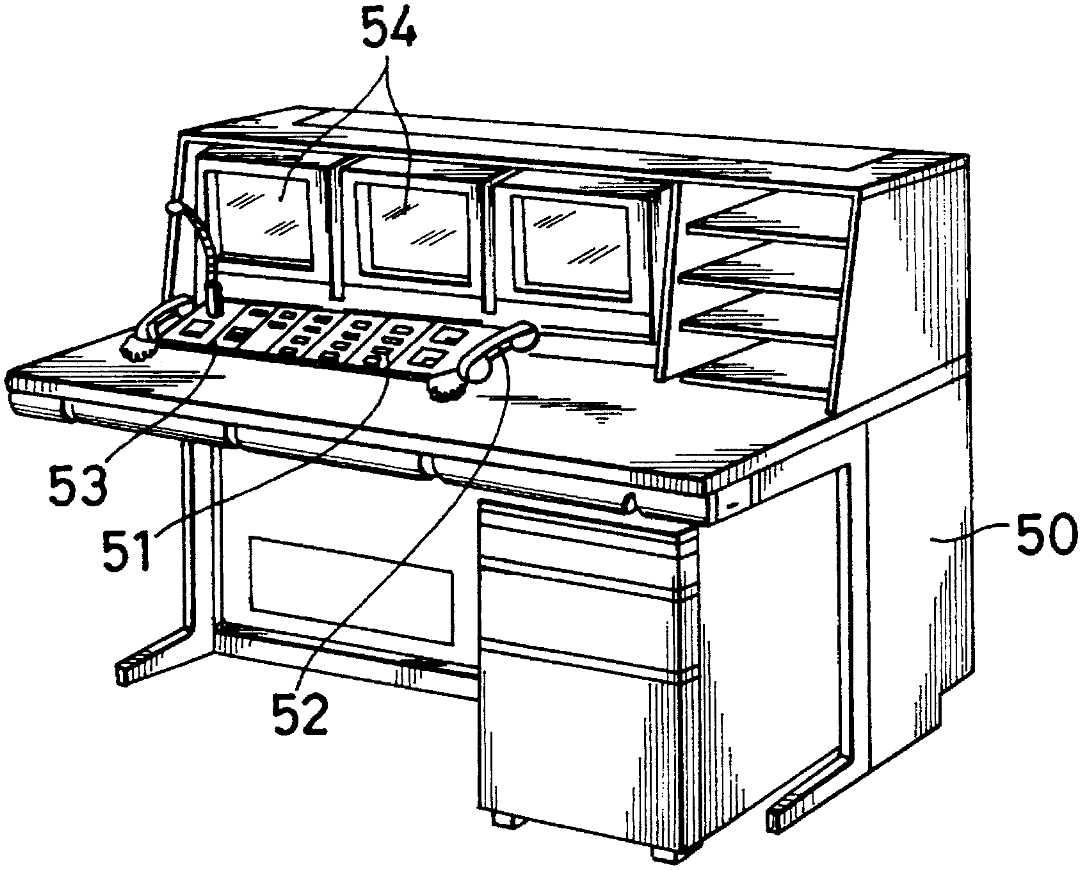
FIG. 28 (PRIOR ART)
FIG. 28 is a perspective view of the desk installed on the conventional dealing board.
Figure 29:
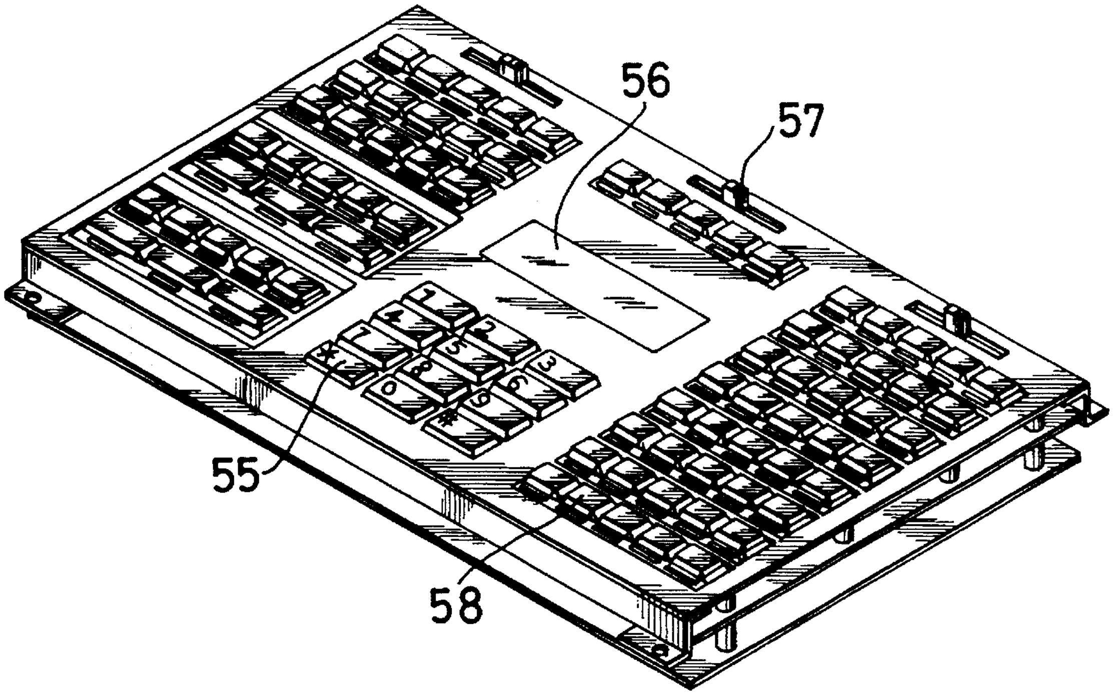
FIG. 29 (PRIOR ART)
FIG. 29 is a perspective view of a panel unit of the conventional dealing board.
Figure 30:
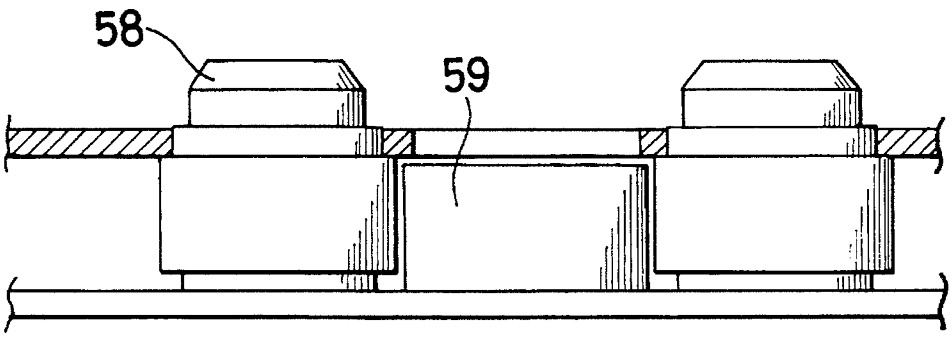
FIG. 30 (PRIOR ART)
FIG. 30 is a section of the panel unit shown in FIG. 29.
Figure 31:
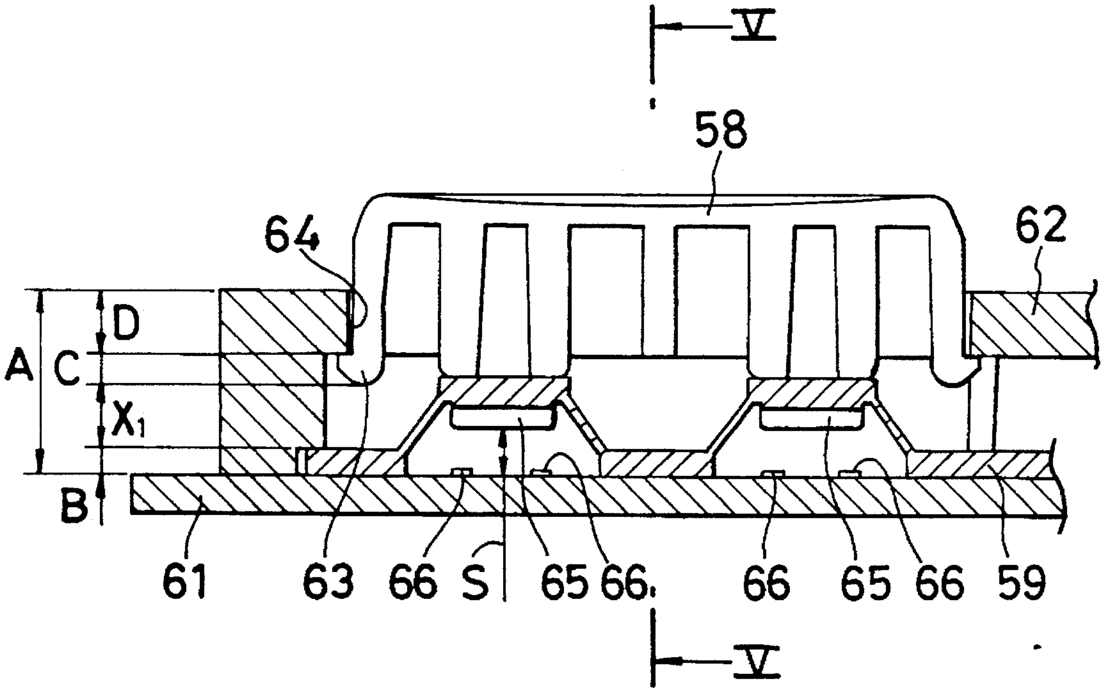
FIG. 31 (PRIOR ART)
FIG. 31 is a section of an operation button installed on the conventional keyboard.
Figure 32:
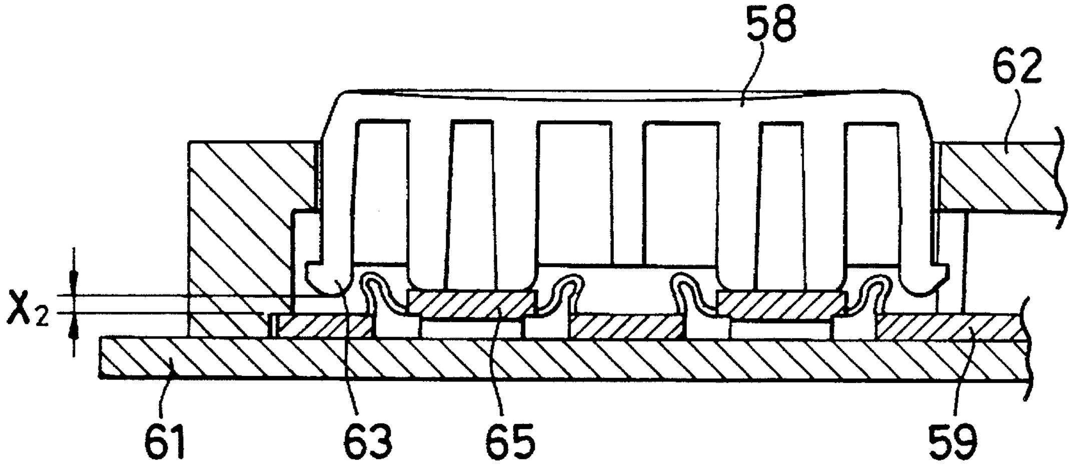
FIG. 32 (PRIOR ART)
FIG. 32 is a section showing an operation condition of the operation button.
Figure 33:
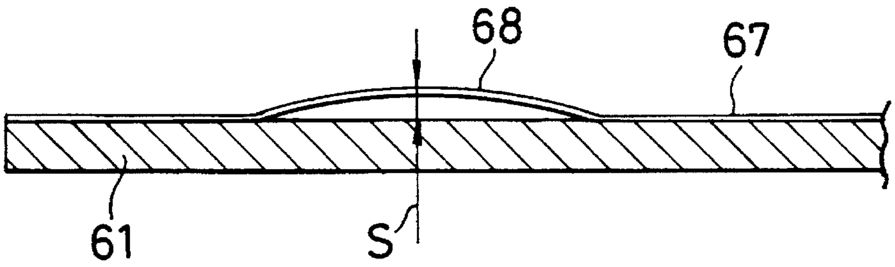
FIG. 33 (PRIOR ART)
FIG. 33 is a section of another operation button employed on the conventional keyboard unit.
Figure 34:
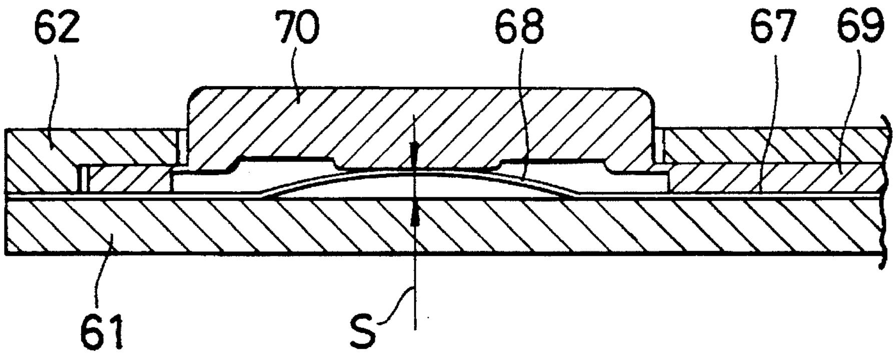
FIG. 34 (PRIOR ART)
FIG. 34 is a section of still another operation button used on the conventional keyboard unit.
Figure 35:
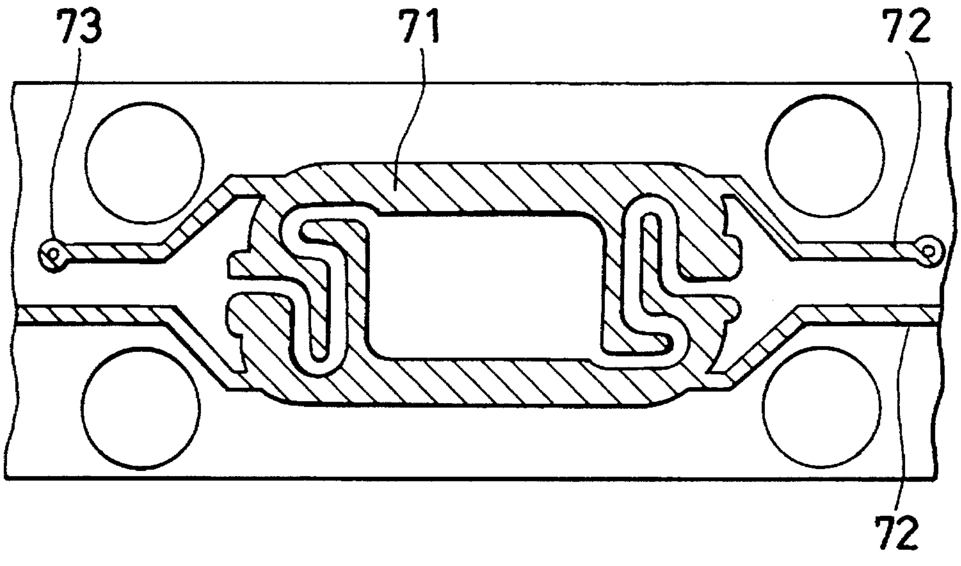
FIG. 35 (PRIOR ART)
FIG. 35 is a detailed view of the contact installed on the conventional keyboard unit.

The carbon contact 35 shown in FIG. 27 has a pair of contacts 31*a* and one earth pattern 35*b*. The earth pattern 35*b* surrounds the contacts 31*a*. The earth pattern 35*b* has a solder coating thereon in order to improve its conductivity. Electrodes of the contacts 31*a* have buyer holes 35*c*. In order to prevent static electricity noise from conveying, a signal pattern (corresponding to q shown in FIG. 35) connected to the contact 1*a* is not provided on a face of the contact 31*a*. In order to improve reliability of electric connection, two buyer holes 35*c* are formed on the electrode of the contact 31*a*.

Next, operation will be explained. When the button 33 is not pressed, resiliency or elasticity of the thin portion 32*b* of the electric conductive contact rubber 32 raises the button 33 to its position shown in FIG. 23, and the engagement portion 33*a* engages with the lower face of the panel 34 preventing the button 33 from dropping out of the hole 34*a*.

Pressing the button 33 lowers the contact portion 32*a* by the stroke S and the contact portion 32*a* comes in contact with the contacts 31*a* in order to electrically connect these contacts 31*a* to each other. Then, the engagement portion 33*a* of the button 33 lowers through the relief holes 32*c* and 31*b* formed in the electric conductive contact rubber 32 and the printed substrate 31 without any conflict of the electric conductive contact rubber 32 and the printed substrate 31.

The thickness size A' measured from the top face of the printed substrate 31 to the top face of the panel 34 is determined with reference to the thickness size B of the electric conductive contact rubber 32 and the thickness size D of the panel 34, without relation to the stroke S. Consequently, it is possible to make the thickness size A' small by making these thickness sizes B and D of the electric conductive contact rubber 32 and the panel 34 even when the stroke S is large. As a result, it is possible to reduce considerably the non-seeing range Z' of the display 36 even when the operator watches the display 36 slantly through the open portion 31*c* formed in the printed substrate 31 as shown by the sight line Y in FIG. 25.

Static electricity noise disadvantageously impressed to the button 33 through a finger tip of the operator pressing the button due to the thickness size A' of small is conveyed to the earth pattern 35*b* provided with a solder coating and placed around the contacts 31*a*, thereby a conveyance of static electricity from the buyer holes 35*c* formed on the electrode of the contact 31*a* to the signal pattern is surely prevented. The earth pattern 35*b* is formed simultaneously with the signal pattern and the buyer holes 35*c*, a manufacturing cost of the printed substrate 31 is low.

Concerning the keyboard unit provided with the printed substrate 31, the printed substrate 31 has the electric conductive contact rubber 32 and the panel 34, respectively formed thereon and the buttons 33 for contacting the contact 31*a* of the printed substrate 31 to the contact portion 32*a* of the electric conductive contact rubber 32 is inserted into a plurality of holes 34*a* open in the panel 34 so as to move freely and vertically. In addition, relief holes 32*c* and 31*b*, through which the engagement portions 33*a* are inserted when the button 33 is pressed, are formed in the portions corresponding to the engagement portions 33*a* adapted to prevent the button 33 from coming out of the relief holes 32*c* and 31*b*, and the earth pattern 35*b* is formed around the contact 31*a* of the printed substrate 31, thereby the engagement portion 33*a* of the pressing button 33 is inserted through the relief holes 32*c* and 31*b* and lowers without any intervention of the electric conductive contact rubber 32 and the printed substrate 31. In consequence, it is possible to make the thickness size measured from the top face of the printed substrate 31 and the top face of the panel 34 small without lessening the stroke of the button 33.

The non-recognizable or watchable range of the display 36 when the display 36 is slantly seen is exceedingly reduced improving a visuability of the display 36 or without a deterioration of the visuability. Additionally, an operation or manual feeling of the operator obtained then he or she presses the button 33 is not deteriorated, as well as a durability of the mechanism of the panel unit is improved very much attaining its high reliability.

According to the panel unit of the present invention, static electricity impressed to the button 33 when it is pressed is transferred to the earth pattern 35*b* around the contacts 31*a* before being transferred to the signal pattern connected to the contacts 31*a*, therefore static electricity is not transferred to the signal pattern preventing the electronic circuits from erroneous operating due to such static electricity noise and heightening a reliability of the mechanism or system.

What is claimed is:

1. A panel unit of a dealing board, comprising:

a display, a keyboard unit, arranged on an upper surface of said display and having a plurality of buttons, wherein said display is divided into individual indication which respectively display function names corresponding to said plurality of buttons, said keyboard unit comprises a printed substrate arranged on said display and having fixed contacts, which form switches, provided for respective buttons, an electric conductive contact rubber located on said printed substrate and provided with moving contacts opposing to said fixed contacts and a panel which is positioned on said electric conductive contact rubber and provided with said plurality of buttons, a plurality of holes are formed in said panel, said buttons are fitted into said plurality of holes to be vertically movable so that the fixed contacts of said printed substrate come in contact with the movable contacts of said electric conductive contact rubber while being kept in contact with said electric conductive contact rubber, said buttons are respectively provided with an engagement portion which prevents the buttons themselves from coming off from said panel, a relief hole in which said button is fitted when the engagement portion holds down said button is formed in said electric conductive contact rubber and said printed substrate, respectively, and said electric conductive contact rubber and said printed substrate are provided with a through hole for making said individual indication corresponding to said buttons visible.

2. A panel unit of a dealing board according to claim 1, wherein said panel unit is provided with a keyboard unit provided with a ground pattern in which a solder coat is applied to peripheries of the fixed contacts of said printed substrate.

* * * * *